United States Patent
Yang et al.

(10) Patent No.: US 11,522,529 B2
(45) Date of Patent: Dec. 6, 2022

(54) DUTY CYCLE DETECTION CIRCUIT AND DUTY CYCLE CORRECTION CIRCUIT INCLUDING THE SAME

(71) Applicant: SK hynix Inc., Icheon-si (KR)

(72) Inventors: Dae Ho Yang, Icheon-si (KR); Kwan Su Shon, Icheon-si (KR); Yo Han Jeong, Icheon-si (KR); Dong Shin Jo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/229,348

(22) Filed: Apr. 13, 2021

(65) Prior Publication Data
US 2022/0209751 A1    Jun. 30, 2022

(30) Foreign Application Priority Data

Dec. 29, 2020 (KR) .................. 10-2020-0185905

(51) Int. Cl.
*H03K 3/017* (2006.01)
*G11C 7/22* (2006.01)

(52) U.S. Cl.
CPC ............. *H03K 3/017* (2013.01); *G11C 7/222* (2013.01)

(58) Field of Classification Search
None
See application file for complete search history.

(56) References Cited

U.S. PATENT DOCUMENTS

| 7,560,963 B2 | 7/2009 | Yun et al. |
| 10,601,410 B1* | 3/2020 | Satoh ................. H03K 3/017 |
| 10,884,674 B2* | 1/2021 | Hagiwara ............. H03K 5/2472 |

OTHER PUBLICATIONS

Masaya Miyahara et al., A Low-Noise Self-Calibrating Dynamic Comparator for High-Speed ADCs, IEEE Asian Solid-State Circuits Conference, Nov. 3-5, 2008, Fukuoka, Japan, pp. 269-272.

* cited by examiner

*Primary Examiner* — Cassandra F Cox
(74) *Attorney, Agent, or Firm* — William Park & Associates Ltd.

(57) ABSTRACT

Devices and methods for detecting and correcting duty cycles are described. An input switching unit is configured to perform at least one of an operation of outputting differential input signals as a first combination of first and second output signals and an operation of outputting the differential input signals as a second combination of the first and second output signals, according to one of a plurality of control signals. A comparator is configured to receive the first output signal through a first input terminal thereof, to receive the second output signal through a second input terminal thereof, to generate duty detection signals by comparing the signal of the first input terminal and the signal of the second input terminal according to at least another one of the plurality of control signals, and to adjust an offset of at least one of the first input terminal and the second input terminal.

12 Claims, 7 Drawing Sheets

DUTY CYCLE DETECTION CIRCUIT AND DUTY CYCLE CORRECTION CIRCUIT INCLUDING THE SAME

CROSS-REFERENCES TO RELATED APPLICATION

The present application claims priority under 35 U.S.C. § 119(a) to Korean application No. 10-2020-0185905, filed on Dec. 29, 2020, in the Korean Intellectual Property Office, which is incorporated herein by reference in its entirety.

BACKGROUND

1. Technical Field

Various embodiments generally relate to a semiconductor circuit, and particularly, to a duty cycle detection circuit and a duty cycle correction circuit including the same.

2. Related Art

In a semiconductor memory and a semiconductor circuit operating based on a clock signal, such as a CPU or a GPU that controls the semiconductor memory, it is very important that the duty of the clock signal is accurately controlled. For example, in a semiconductor memory in which data is inputted/outputted at a rising edge and a falling edge of a clock signal, when the duty of the clock signal is not accurately 50%, a timing between the rising edge and the falling edge thereof is distorted, so that data may not be inputted/outputted with an accurate timing.

Therefore, in various semiconductor circuits operating based on the clock signal, a duty cycle correction circuit for correcting the duty of the clock signal is used. For reference, the fact that the duty of the clock signal is 50% means that lengths of a 'high' level period and a 'low' level period of the clock signal are substantially the same.

The duty cycle correction circuit may essentially include a duty cycle detection circuit for detecting the duty of an input signal, that is, the clock signal. The duty cycle detection circuit may include an offset due to a process variation, and the offset may affect the output of the duty cycle detection circuit, thereby reducing the accuracy of duty cycle correction.

SUMMARY

Various embodiments are directed to providing a duty cycle detection circuit capable of stably compensating for an offset in a duty cycle detection process and a duty cycle correction circuit including the same.

In an embodiment, a duty cycle detection circuit may include: an input switching unit and a comparator. The input switching unit may be configured to perform at least one of an operation of outputting differential input signals as a first combination of first and second output signals and an operation of outputting the differential input signals as a second combination of the first and second output signals, according to one of a plurality of control signals. The comparator may be configured to receive the first output signal through a first input terminal thereof, to receive the second output signal through a second input terminal thereof, to generate duty detection signals by comparing the signal of the first input terminal and the signal of the second input terminal according to at least another one of the plurality of control signals, and to adjust an offset of at least one of the first input terminal and the second input terminal.

In an embodiment, a duty cycle detection circuit may include: an input switching unit, a comparator, and an offset control logic. The input switching unit may be configured to output differential input signals as a first combination of first and second output signals when an input switching control signal is at a first level, and to output the differential input signals as a second combination of the first and second output signals when the input switching control signal is at a second level. The comparator may be configured to receive the first output signal through a first input terminal thereof, to receive the second output signal through a second input terminal thereof, to generate duty detection signals by comparing the signal of the first input terminal and the signal of the second input terminal, and to adjust an offset of at least one of the first input terminal and the second input terminal according to offset adjustment codes. The offset control logic may be configured to generate the offset adjustment codes by comparing duty detection signals generated according to the first combination with duty detection signals generated according to the second combination.

In an embodiment, a duty cycle correction circuit may include: a duty adjustment unit and a duty cycle detection circuit. The duty adjustment unit may be configured to output signals, which are obtained by adjusting a duty of differential dock signals according to duty detection signals, as duty-adjusted differential clock signals. The duty cycle detection circuit may be configured to compare current duty detection signals and previous duty detection signals, which are generated by a first combination and a second combination of the duty-adjusted differential dock signals inputted to a first input terminal and a second input terminal thereof at a time difference, and to adjust an offset of at least one of the first input terminal and the second input terminal.

DETAILED DESCRIPTION

Hereinafter, embodiments of the present technology will be described in more detail with reference to the accompanying drawings.

Figure 1:
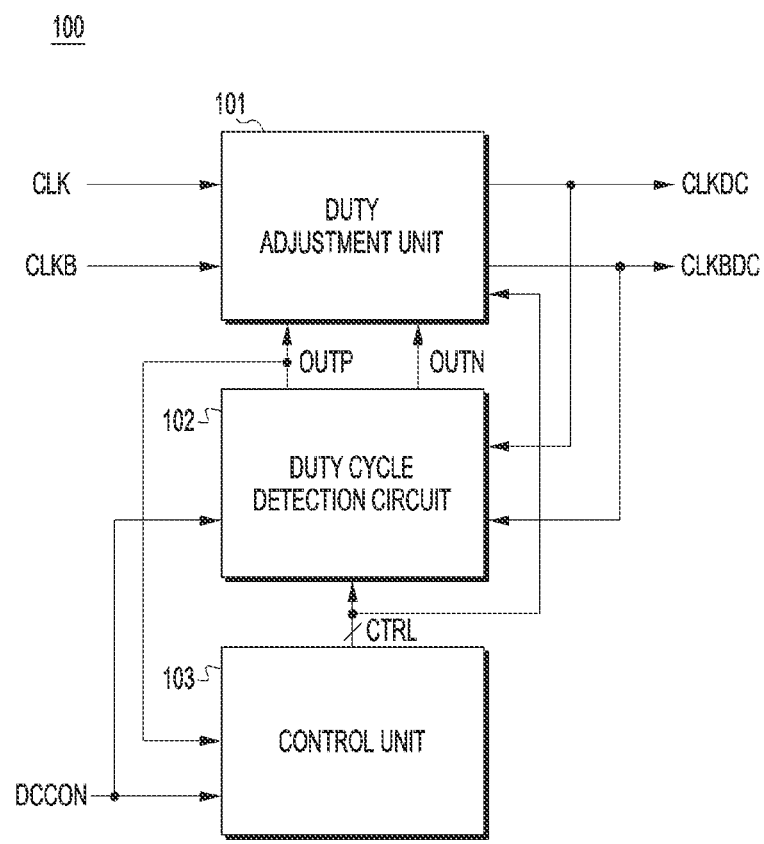
FIG. 1 is a block diagram illustrating a configuration of a duty cycle correction circuit in accordance with an embodiment of the present disclosure.

FIG. 1 is a block diagram illustrating a configuration of a is duty cycle correction circuit 100 in accordance with an embodiment of the present disclosure.

Referring to FIG. 1, the duty cycle correction circuit 100 in accordance with the embodiment may include a duty adjustment unit 101, a duty cycle detection circuit 102, and a control unit 103.

The duty adjustment unit 101 may adjust the duty of input signals, that is, differential clock signals CLK and CLKB, to generate output signals according to duty detection signals OUTP and OUTN, as duty-adjusted differential clock signals CLKDC and CLKBDC.

By adjusting the duty of the input signals, that is, the differential clock signals CLK and CLKB, according to at least one of a plurality of control signals CTRL and the duty detection signals OUTP and OUTN, the duty adjustment unit 101 may output signals as the duty-adjusted differential clock signals CLKDC and CLKBDC.

By detecting the duty of the input signals, that is, the duty-adjusted differential clock signals CLKDC and CLKBDC, the duty cycle detection circuit 102 may generate the duty detection signals OUTP and OUTN.

The duty cycle detection circuit 102 may adjust an offset of at least one of a first input terminal and a second input terminal according to at least one of the plurality of control signals CTRL.

According to the duty detection signals OUTP and OUTN, the control unit 103 may generate the plurality of control signals CTRL for controlling an operation of at least one of the duty adjustment unit 101 and the duty cycle detection circuit 102.

At least one of the control unit 103 and the duty cycle detection circuit 102 may be enabled according to an enable signal DCCON.

Figure 2:
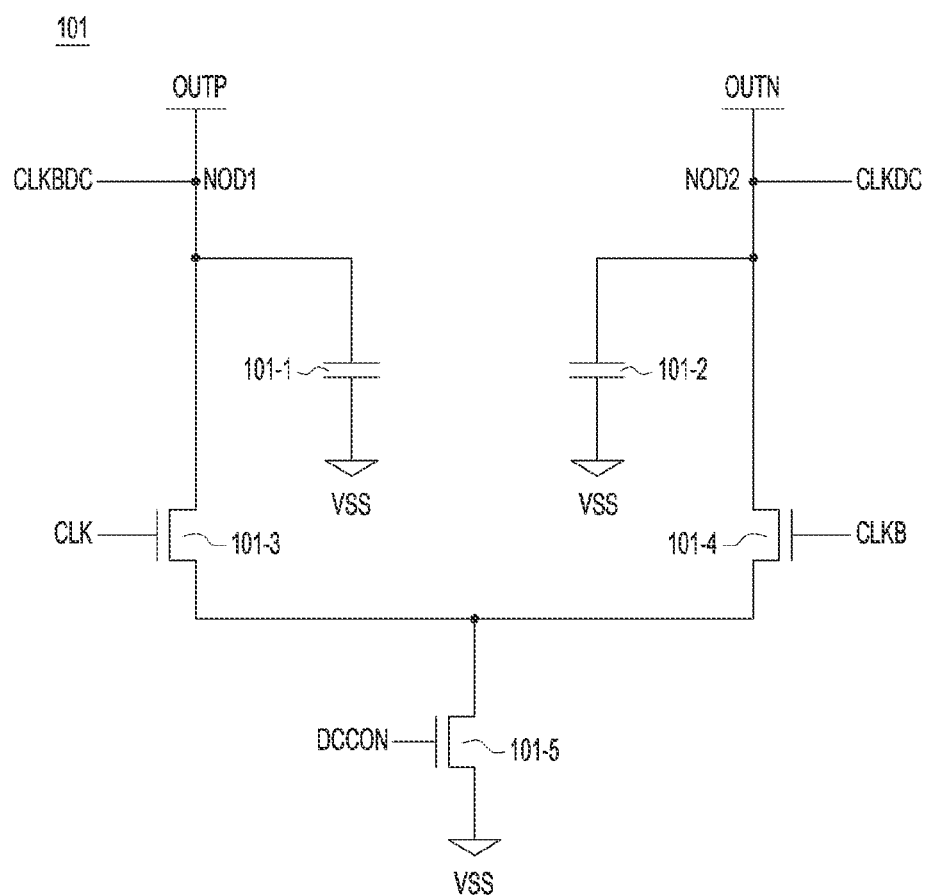
FIG. 2 is a diagram illustrating a configuration of a duty adjustment unit of FIG. 1.

FIG. 2 is a diagram illustrating a configuration of the duty adjustment unit 101 of FIG. 1.

Referring to FIG. 2, the duty adjustment unit 101 may include first and second capacitors 101-1 and 101-2 and first to third transistors 101-3 to 101-5.

The first transistor 101-3 may have a drain terminal electrically connected to a first node NOD1. The first transistor 101-3 may also have a gate terminal to which any one of the differential clock signals CLK and CLKB, for example, CLK, may be inputted.

Any one of the duty detection signals OUTP and OUTN, for example, OUTP, may be applied to the first node NOD1 as first power.

The second transistor 101-4 may have a drain terminal electrically connected to a second node NOD2. The second transistor 101-4 may also have a gate terminal to which the other one of the differential dock signals CLK and CLKB, for example, CLKB, may be inputted.

The other one of the duty detection signals OUTP and OUTN, for example, OUTN, may be applied to the second node NOD2 as second power.

The third transistor 101-5 may have a drain terminal electrically connected in common to a source terminal of the first is transistor 101-3 and a source terminal of the second transistor 101-4.

The third transistor 101-5 may also have a gate terminal to which the enable signal DCCON is inputted, and a source terminal electrically connected to a ground terminal.

Between the first node NOD1 and the ground terminal, the first capacitor 101-1 may be electrically connected in parallel to the first transistor 101-3.

Between the second node NOD2 and the ground terminal, the second capacitor 101-2 may be electrically connected in parallel to the second transistor 101-4.

Any one of the duty-adjusted differential clock signals CLKDC and CLKBDC, for example, CLKBDC, may be outputted through the first node NOD1.

The other one of the duty-adjusted differential dock signals CLKDC and CLKBDC, for example, CLKDC, may be outputted through the second node NOD2.

An operation of the duty adjustment unit 101 configured as above will be described as follows.

During the high level period of the enable signal DCCON, the third transistor 101-5 may be turned on to enable a current path of the duty adjustment unit 101.

On the other hand, since the third transistor 101-5 may be turned off during the low level period of the enable signal DCCON, the current path of the duty adjustment unit 101 may be blocked, so that the operation of the duty adjustment unit 101 may be stopped.

As the first transistor 101-3 may be turned off during the low level period of CLK, the first capacitor 101-1 may be charged to an OUTP level. Also, as the first transistor 101-3 may be turned on during the high level period of CLK, the first capacitor 101-1 may be discharged, thereby generating CLKBDC.

Similarly, as the second transistor 101-4 may be turned off during the low level period of CLKB, the second capacitor 101-2 may be charged to an OUTP level. Also, as the second transistor 101-4 is turned on during the high level period of CLKB, the second capacitor 101-2 may be discharged, thereby generating CLKDC.

Figure 3:
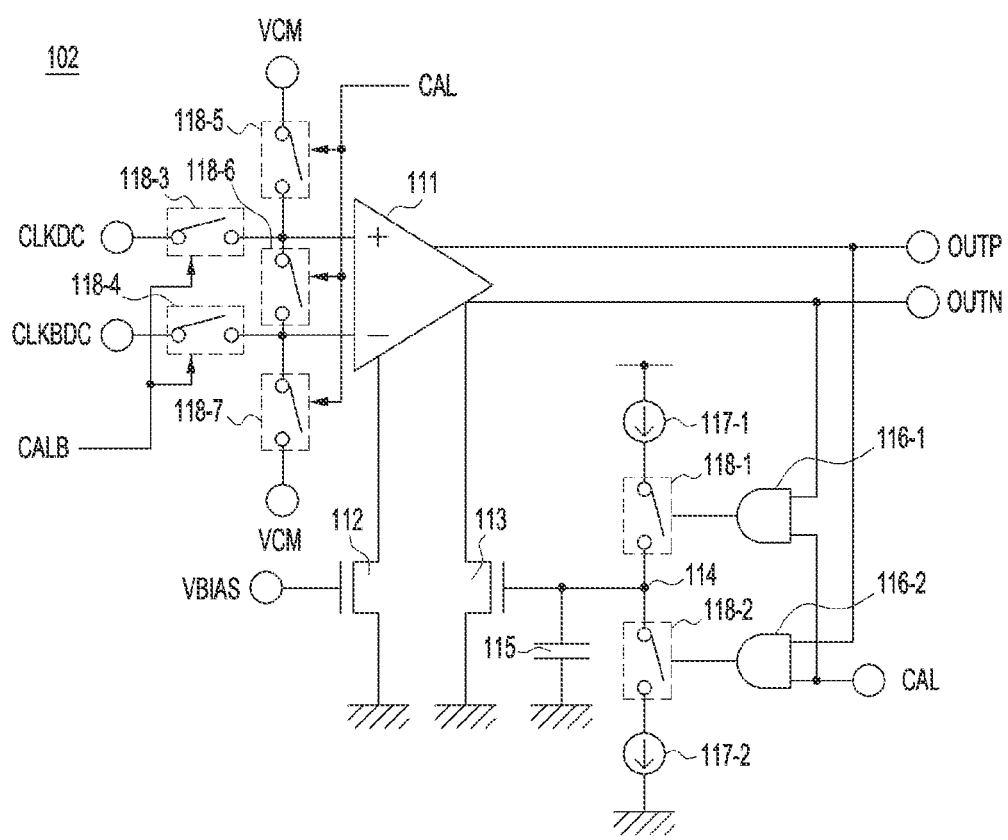
FIG. 3 is a diagram illustrating a configuration of a duty cycle detection circuit of FIG. 1.

FIG. 3 is a diagram illustrating a configuration of the duty cycle detection circuit 102 of FIG. 1.

Referring to FIG. 3, the duty cycle detection circuit 102 may include a comparator 111, a first transistor 112, a second transistor 113, a capacitor 115, a first logic gate 116-1, a second logic gate 116-2, a current source 117-1, a current sink 117-2, and a plurality of switches 118-1 to 118-7.

By detecting the duty of the duty-adjusted differential clock signals CLKDC and CLKBDC inputted to a first input terminal (+) and a second input terminal (−) thereof, the comparator 111 may generate the duty detection signals OUTP and OUTN.

Between the comparator 111 and the ground terminal, the first transistor 112 and the second transistor 113 may be electrically connected to form current paths.

The first transistor 112 may allow a current corresponding to a bias voltage VBIAS to flow to the ground terminal.

Between a gate terminal thereof and a node 114, the second transistor 113 may be electrically connected in parallel to the capacitor 115.

The second transistor 113 may allow a current corresponding to a voltage level of the capacitor 115 to flow to the ground terminal.

The first logic gate 116-1 may perform an AND operation on any one of the duty detection signals OUTP and OUTN, for example, OUTN, and an offset adjustment signal CAL, and output an ANDed signal.

The second logic gate 116-2 may perform an AND operation on the other one of the duty detection signals OUTP and OUTN, for example, OUTP, and the offset adjustment signal CAL, and output an ANDed signal.

The first switch 118-1 may be electrically connected between the current source 117-1 and the node 114.

The first switch 118-1 may be turned on/off according to the output of the first logic gate 116-1.

The second switch 118-2 may be electrically connected to between the node 114 and the current sink 117-2.

The second switch 118-2 may be turned on/off according to the output of the second logic gate 116-2.

The third switch 118-3 may be electrically connected to the first input terminal (+) of the comparator 111.

The fourth switch 118-4 may be electrically connected to the second input terminal (−) of the comparator 111.

According to an inverted offset adjustment signal CALB, the third switch 118-3 and the fourth switch 118-4 may be turned on/off.

The fifth switch 118-5 may have one end electrically connected to a DC voltage (VCM) terminal and the other end electrically connected to the first input terminal (+) of the comparator 111.

The sixth switch 118-6 may have one end electrically connected to the first input terminal (+) of the comparator 111 and the other end electrically connected to the second input terminal (−) of the comparator 111.

The seventh switch 118-7 may have one end electrically connected to the second input terminal (−) of the comparator 111 and the other end electrically connected to the DC voltage (VCM) terminal.

According to the offset adjustment signal CAL, the fifth to seventh switches 118-5 to 118-7 may be turned on/off.

An offset adjustment operation of an embodiment of the duty cycle detection circuit 102 described above will be described as follows.

Except in a normal operation of the duty cycle correction circuit 100, the offset adjustment operation may be performed by an external instruction and/or at an internally determined time in a period.

When the offset adjustment operation is started, according to a high-level offset adjustment signal CAL, (CALB=Low) the third and fourth switches 118-3 and 118-4 may be turned off and the fifth to seventh switches 118-5 to 118-7 may be turned on.

As the fifth to seventh switches 118-5 to 118-7 are turned on, external input, that is, the duty-adjusted differential clock signals CLKDC and CLKBDC are substantially prevented from being inputted to the input terminals (+) and (−) of the comparator 111, and the input terminals (+) and (−) of the comparator 111 are precharged with a DC voltage (VCM).

Any one of the duty detection signals OUTP and OUTN may be outputted at a high level when there is an offset in any one of the input terminals (+) and (−) of the comparator 111.

For example, when OUTN is at a high level, the first switch 118-1 may be turned on according to the output of the first logic gate 116-1.

As the first switch 118-1 is turned on, a current flows from the current source 117-1 to the capacitor 115, so that the voltage level of the capacitor 115 is increased.

As the voltage level of the capacitor 115 is increased, by increasing a current flowing to the ground terminal through the second transistor 113, the offset may be removed.

On the other hand, when OUTP is at a high level, the second switch 118-2 may be turned on according to the output of the second logic gate 116-2.

As the second switch 118-2 is turned on, a current flows from the capacitor 115 to the current sink 117-2, so that the voltage level of the capacitor 115 is decreased.

As the voltage level of the capacitor 115 is decreased, by decreasing a current flowing to the ground terminal through the second transistor 113, the offset may be removed.

Figure 4:
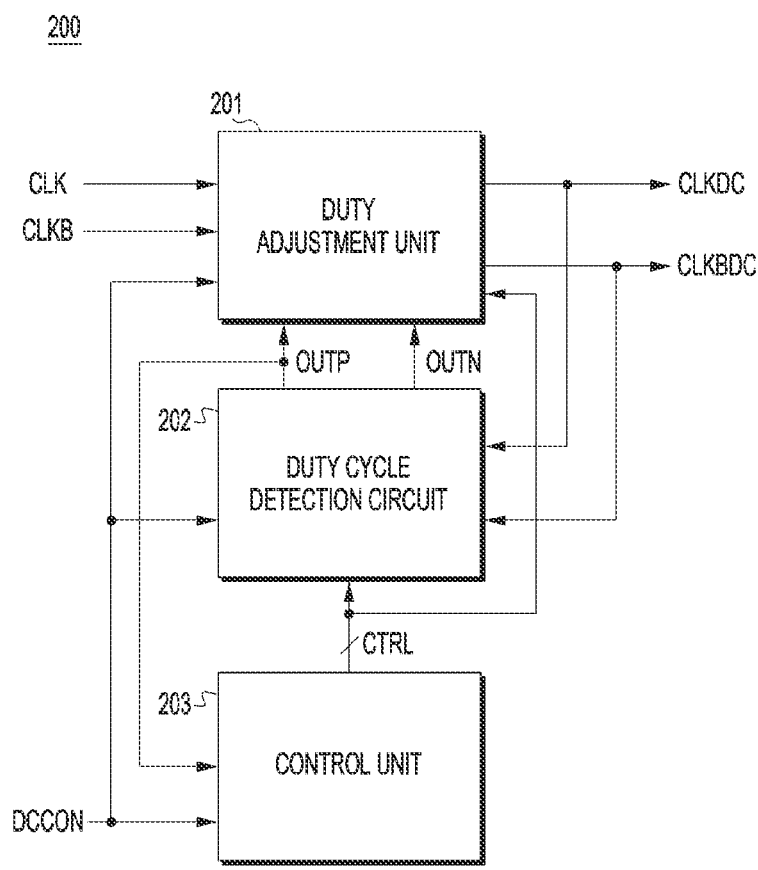
FIG. 4 is a block diagram illustrating a configuration of a duty cycle correction circuit in accordance with another embodiment of the present disclosure.

FIG. 4 is a diagram illustrating a configuration of a duty cycle correction circuit 200 in accordance with another embodiment of the present disclosure.

Referring to FIG. 4, the duty cycle correction circuit 200 in accordance with another embodiment may include a duty adjustment unit 201, a duty cycle detection circuit 202, and a control unit 203.

By adjusting the duty of input signals, that is, differential dock signals CLK and CLKB according to duty detection signals OUTP and OUTN, the duty adjustment unit 201 may output signals as duty-adjusted differential dock signals CLKDC and CLKBDC.

Also, by adjusting the duty of the input signals, that is, the differential clock signals CLK and CLKB according to at least one of a plurality of control signals CTRL and the duty detection signals OUTP and OUTN, the duty adjustment unit 201 may output signals as the duty-adjusted differential clock signals CLKDC and CLKBDC.

The duty adjustment unit 201 may be configured in the same manner as in FIG. 2.

The duty cycle detection circuit 202 may generate the is duty detection signals OUTP and OUTN by detecting the duty of the input signals inputted through a first input terminal and a second input terminal, that is, the duty-adjusted differential clock signals CLKDC and CLKBDC. Then, an offset of at least one of the first terminal and the second input terminal may be adjusted.

The duty cycle detection circuit 202 may compare current duty detection signals OUTP and OUTN and previous duty detection signals OUTP and OUTN, which are generated by a first combination and a second combination of the duty-adjusted differential clock signals CLKDC and CLKBDC inputted to the first input terminal and the second input terminal thereof at a time difference. Then, the amount of current of at least one of the first input terminal and the second input terminal may be adjusted.

The duty cycle detection circuit 202 may generate the duty detection signals OUTP and OUTN by inputting the first combination of the duty-adjusted differential dock signals CLKDC and CLKBDC to the first input terminal and the second input terminal. Then, the duty detection signals OUTP and OUTN may be generated by inputting the second combination of the duty-adjusted differential clock signals CLKDC and CLKBDC to the first input terminal and the second input terminal.

The duty cycle detection circuit 202 may compare the duty detection signals OUTP and OUTN generated first with the duty detection signals OUTP and OUTN generated next, and adjust the amount of current of at least one of the first input terminal and the second input terminal.

By adjusting the amount of current of at least one of the first input terminal and the second input terminal, the duty cycle detection circuit 202 may adjust an offset of at least one of the first input terminal and the second input terminal.

The first combination may be a combination for allowing CLKDC of the duty-adjusted differential clock signals CLKDC and CLKBDC to be inputted to the first input terminal and allowing CLKBDC thereof to be inputted to the second input terminal.

The second combination may be a combination opposite to the first combination, that is, a combination for allowing CLKBDC of the duty-adjusted differential dock signals CLKDC and CLKBDC to be inputted to the first input terminal and allowing CLKDC thereof to be inputted to the second input terminal.

The operation of the duty cycle detection circuit 202 may be controlled according to at least one of a plurality of control signals CTRL.

The control unit 203 may generate the plurality of control signals CTRL for controlling, according to the duty detection signals OUTP and OUTN, an operation of at least one of the duty to adjustment unit 201 and the duty cycle detection circuit 202.

At least one of the control unit 203 and the duty cycle detection circuit 202 may be enabled according to an enable signal DCCON.

Figure 5:
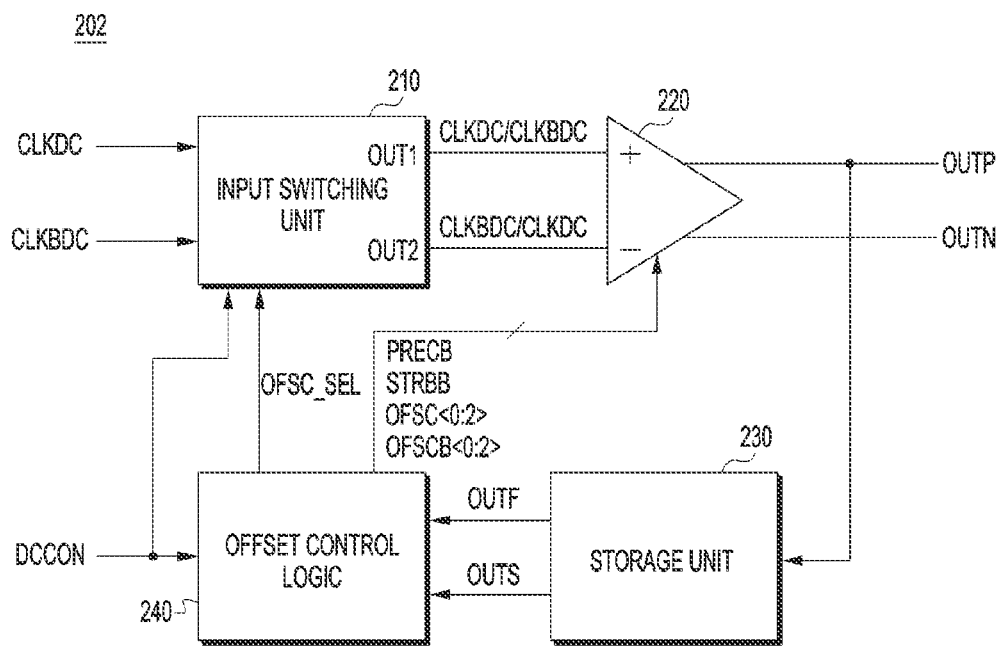
FIG. 5 is a diagram illustrating a configuration of a duty cycle detection circuit of FIG. 4.

FIG. 5 is a diagram illustrating a configuration of the duty cycle detection circuit 202 of FIG. 4.

Referring to FIG. 5, the duty cycle detection circuit 202 may include an input switching unit 210, a comparator 220, a storage unit 230, and an offset control logic 240.

When one OFSC_SEL of the plurality of control signals CTRL is at a first level (for example, a low level), the input switching unit 210 may output differential input signals, that is, the duty-adjusted differential dock signals CLKDC and CLKBDC as a first combination (CLKDC=OUT1 and CLKBDC=OUT2) of first and second output signals OUT1 and OUT2.

OFSC_SEL may be referred to as an input switching control signal.

When the input switching control signal OFSC_SEL is at a second level (for example, a high level), the input switching unit 210 may output the duty-adjusted differential dock signals CLKDC and CLKBDC as a second combination (CLKBDC=OUT1 and CLKDC=OUT2) of the first and second output signals OUT1 and OUT2.

The comparator 220 may receive the first output signal OUT1 through the first input terminal (+) thereof, and receive the second output signal OUT2 through the second input terminal (−) thereof.

By comparing the signal of the first input terminal (+) and the signal of the second input terminal (−) according to some PRECB, STROBB, OFSC<0:2>, and OFSCB<0:2> of the plurality of control signals CTRL, the comparator 220 may generate the duty detection signals OUTP and OUTN, and may adjust an offset of the signal of the first input terminal (+) and the signal of the second input terminal (−).

OFSCB<0:2> may have a logic level opposite to that of OFSC<0:2>. By inverting OFSC<0:2>, OFSBC<0:2> may be generated.

PRECB may be referred to as a precharge signal, STROBB may be referred to as a strobe signal, and OFSC<0:2> and OFSCB<0:2>may be referred to as offset adjustment codes.

The storage unit 230 may store, as a first order detection signal OUTF, any one, for example, OUTP, of the duty detection signals OUTP and OUTN generated according to the first combination of the duty-adjusted differential dock signals CLKDC and CLKBDC.

The storage unit 230 may store, as a second order detection signal OUTS, the duty detection signal OUTP generated according to the second combination of the duty-adjusted differential clock signals CLKDC and CLKBDC.

According to the enable signal DCCON, the offset control logic 240 may generate the precharge signal PRECB, the strobe signal STROBB, the offset adjustment codes OFSC<0:2> and OFSCB<0:2>, and the input switching control signal OFSC_SEL.

The offset control logic 240 may adjust values of the precharge signal PRECB, the strobe signal STROBB, and the input switching control signal OFSC_SEL such that the duty detection is signals OUTP and OUTN are generated according to each of the first combination and the second combination of the duty-adjusted differential clock signals CLKDC and CLKBDC.

According to a result obtained by comparing the first order detection signal OUTF and the second order detection signal OUTS, the offset control logic 240 may adjust values of the offset adjustment codes OFSC<0:2>.

The above embodiment is merely an example in which the offset control logic 240 is included in the duty cycle detection circuit 202, and the offset control logic 240 may also be included as a part of the control unit 203 of FIG. 4.

Figure 6:
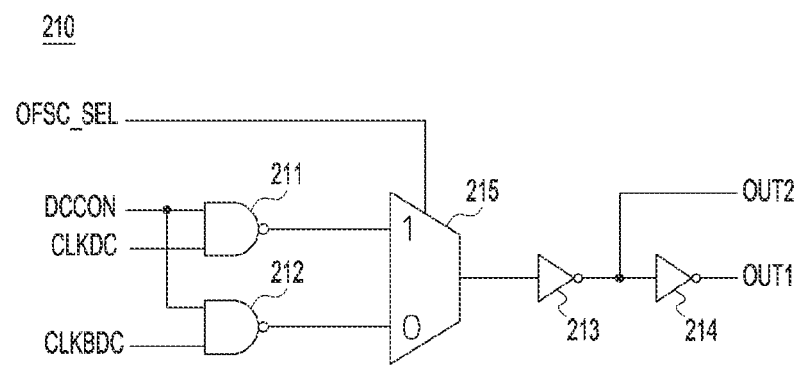
FIG. 6 is a diagram illustrating a configuration of an input switching unit of FIG. 5.

FIG. 6 is a diagram illustrating a configuration of the input switching unit 210 of FIG. 5.

Referring to FIG. 6, the input switching unit 210 may include first to fourth logic gates 211 to 214 and a multiplexer 215.

The first logic gate 211 may perform a NAND operation on the enable signal DCCON and CLKDC of the duty-adjusted differential dock signals CLKDC and CLKBDC, and output a NANDed signal.

The second logic gate 212 may perform a NAND operation on the enable signal DCCON and CLKBDC, and output a NANDed signal.

The multiplexer 215 may multiplex, according to the input switching control signal OFSC_SEL, the output of the first logic gate 211 and the output of the second logic gate 212.

When the input switching control signal OFSC_SEL is at a low level, the multiplexer 215 may select and output the output of the second logic gate 212.

When the input switching control signal OFSC_SEL is at a high level, the multiplexer 215 may select and output the output of the first logic gate 211.

The third logic gate 213 may invert the output of the multiplexer 215 and output the inverted signal as the second output signal OUT2.

The fourth logic gate 214 may invert the output of the third logic gate 213 and output the inverted signal as the first output signal OUT1.

In a state in which the enable signal DCCON is at a high level, when the input switching control signal OFSC_SEL is at a low level, the input switching unit 210 may provide the first combination (OUT1=CLKDC and OUT2=CLKBDC) to the comparator 220 and may provide the second combination (OUT1=CLKBDC and OUT2=CLKDC) to the comparator 220 when the input switching control signal OFSC_SEL is at a high level.

Figure 7:
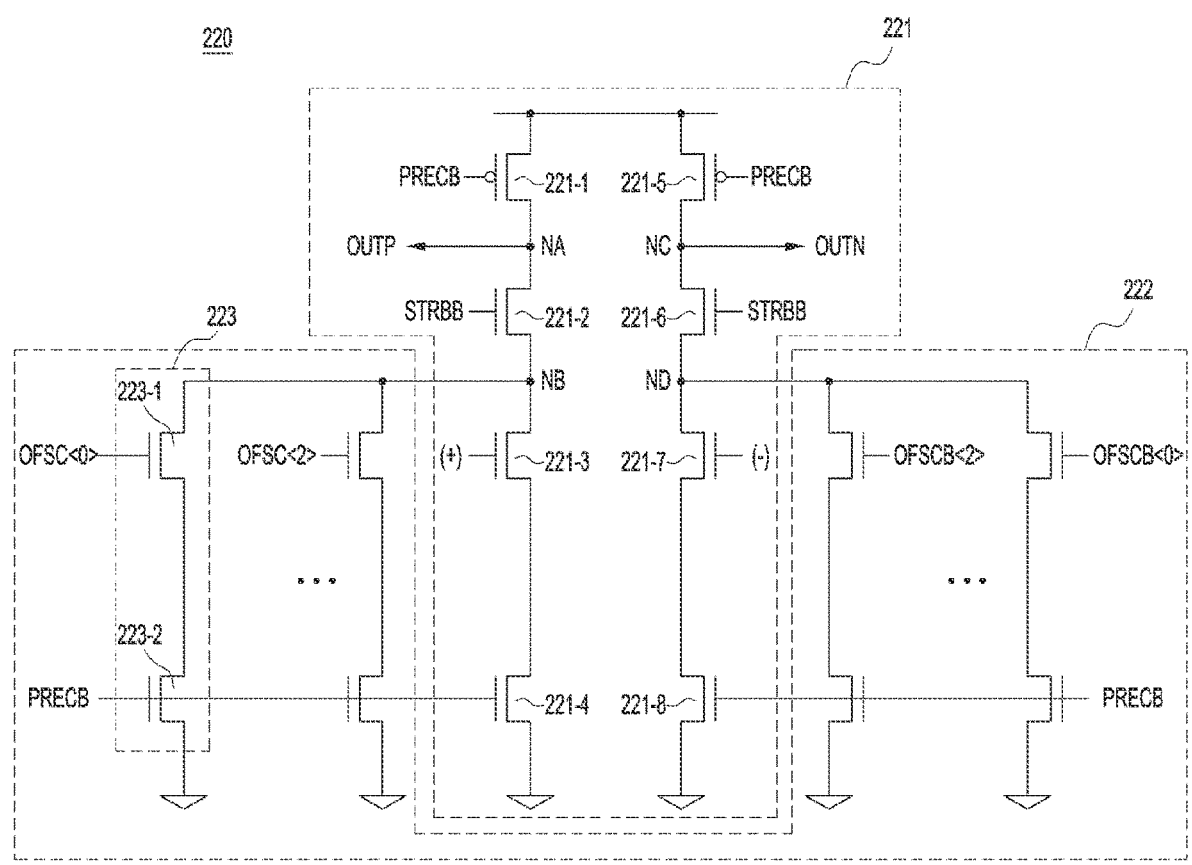
FIG. 7 is a diagram illustrating a configuration of a comparator of FIG. 5.

FIG. 7 is a diagram illustrating a configuration of the comparator 220 of FIG. 5.

Referring to FIG. 7, the comparator 220 may include a comparison unit 221 and an offset adjustment unit 222.

By comparing the signal of the first input terminal (+) and the signal of the second input terminal (−) according to the is precharge signal PRECB and the strobe signal STROBB, the comparison unit 221 may generate the duty detection signals OUTP and OUTN.

The comparison unit 221 may include a plurality of transistors constituting a first current path and a second current path electrically connected to a power supply terminal, that is, first to eighth transistors 221-1 to 221-8.

The first transistor 221-1 may have a source terminal electrically connected to the power supply terminal, a gate terminal to which the precharge signal PRECB is inputted, and a drain terminal electrically connected to a node A (NA).

The second transistor 221-2 may have a drain terminal electrically connected to the node A (NA), a gate terminal to which the strobe signal STROBB is inputted, and a source terminal electrically connected to a node B (NB).

The duty detection signal OUTP may be outputted through the node A (NA).

The third transistor 221-3 may have a drain terminal electrically connected to the node B (NB) and a gate terminal electrically connected to the first input terminal (+).

The fourth transistor 221-4 may have a drain terminal electrically connected to a source terminal of the third transistor 221-3, a gate terminal to which the precharge signal PRECB is inputted, and a source terminal electrically connected to the ground terminal.

The fifth transistor 221-5 may have a source terminal electrically connected to the power supply terminal, a gate terminal to which the precharge signal PRECB is inputted, and a drain terminal electrically connected to a node C (NC).

The sixth transistor 221-6 may have a drain terminal electrically connected to the node C (NC), a gate terminal to which the strobe signal STROBB is inputted, and a source terminal electrically connected to a node D (ND).

The duty detection signal OUTN may be outputted through the node C (NC).

The seventh transistor 221-7 may have a drain terminal electrically connected to the node D (ND) and a gate terminal electrically connected to the second input terminal (−).

The eighth transistor 221-8 may have a drain terminal electrically connected to a source terminal of the seventh transistor 221-7, a gate terminal to which the precharge signal PRECB is inputted, and a source terminal electrically connected to the ground terminal.

According to the offset adjustment codes OFSC<0:2> and OFSCB<0:2>, the offset adjustment unit 222 may adjust an offset of at least one of the first input terminal (+) and the second input terminal (−).

The offset adjustment unit 222 may include a plurality of digital-to-analog conversion units 223.

The plurality of digital-to-analog conversion units 223 may he electrically connected in parallel to each of the first current path and the second current path of the comparison unit 221 and configured to form current paths.

According to the offset adjustment codes OFSC<0:2> and OFSCB<0:2>, the plurality of digital-to-analog conversion units 223 may be configured to have a binary weighted current driving capability.

The plurality of digital-to-analog conversion units 223 may form the current paths in parallel to the comparison unit 221 in correspondence with respective signal bits of the offset adjustment codes OFSC<0:2> and OFSCB<0:2>, respectively.

The plurality of digital-to-analog conversion units 223 may have substantially the same configuration.

Each of the plurality of digital-to-analog conversion units 223 electrically connected to the node B (NB) may include first and second transistors 223-1 and 223-2.

The first transistor 223-1 may have a drain terminal electrically connected to the node B (NB) of the comparison unit 221 and a gate terminal to which one bit of the offset adjustment codes OFSC<0:2> is inputted.

The second transistor 223-2 may have a drain terminal electrically connected to the source terminal of the first transistor 223-1, a gate terminal to which the precharge signal PRECB is inputted, and a source terminal electrically connected to the ground terminal.

Each of the plurality of digital-to-analog conversion is units 223 electrically connected to the node D (ND) may include the first and second transistors 223-1 and 223-2.

The first transistor 223-1 may have a drain terminal electrically connected to the node D (ND) of the comparison unit 221 and a gate terminal to which one bit of the offset adjustment codes OFSCB<0:2> is inputted.

The second transistor 223-2 may have a drain terminal electrically connected to the source terminal of the first transistor 223-1, a gate terminal to which the precharge signal PRECB is inputted, and a source terminal electrically connected to the ground terminal.

Hereinafter, an operation of the comparator 220 will be described as follows.

During a period in which the precharge signal PRECB is at a low level, the comparator 220 may precharge the node A (NA) and the node C (NC), through which the duty detection signals OUTP and OUTN are outputted, respectively, to a power supply voltage level.

The strobe signal STROBB may be at a low level during the period in which the precharge signal PRECB is at a low level.

The strobe signal STROBB may substantially maintain the low level during a set time for which the precharge signal PRECB transitions to a high level and the first output signal OUT1 and the second output signal OUT2 of the input switching unit 210 inputted to the first input terminal (+) and the second input terminal (−) are is stabilized.

With the elapse of the set time for which the first output signal OUT1 and the second output signal OUT2 are stabilized, the strobe signal STROBB transitions to a high level, so that the duty detection signals OUTP and OUTN may be generated due to a duty difference between the signals inputted to the first input terminal (+) and the second input terminal (−).

According to values of the offset adjustment codes OFSC<0:2>, the plurality of digital-to-analog conversion units 223, which receive the offset adjustment codes OFSC<0:2>, may increase or decrease the amount of current of the first input terminal (+).

The plurality of digital-to-analog conversion units 223, which receive the offset adjustment codes OFSCB<0:2>, may decrease or increase the amount of current of the second input terminal (−) according to values of the offset adjustment codes OFSCB<0:2>, in contrast to the plurality of digital-to-analog conversion units 223 which receive the offset adjustment codes OFSC<0:2>.

The plurality of digital-to-analog conversion units 223, which receive the offset adjustment codes OFSCB<0:2>, may decrease the amount of current of the second input terminal (−) when the plurality of digital-to-analog conversion units 223, which receive the offset adjustment codes OFSC<0:2>, increase the amount of current of the first input terminal (+).

When the plurality of digital-to-analog conversion units is 223, which receive the offset adjustment codes OFSC<0:2>, decrease the amount of current of the first input terminal (+), the plurality of digital-to-analog conversion units 223, which receive the offset adjustment codes OFSCB<0:2>, may increase the amount of current of the second input terminal (−).

Figure 8:
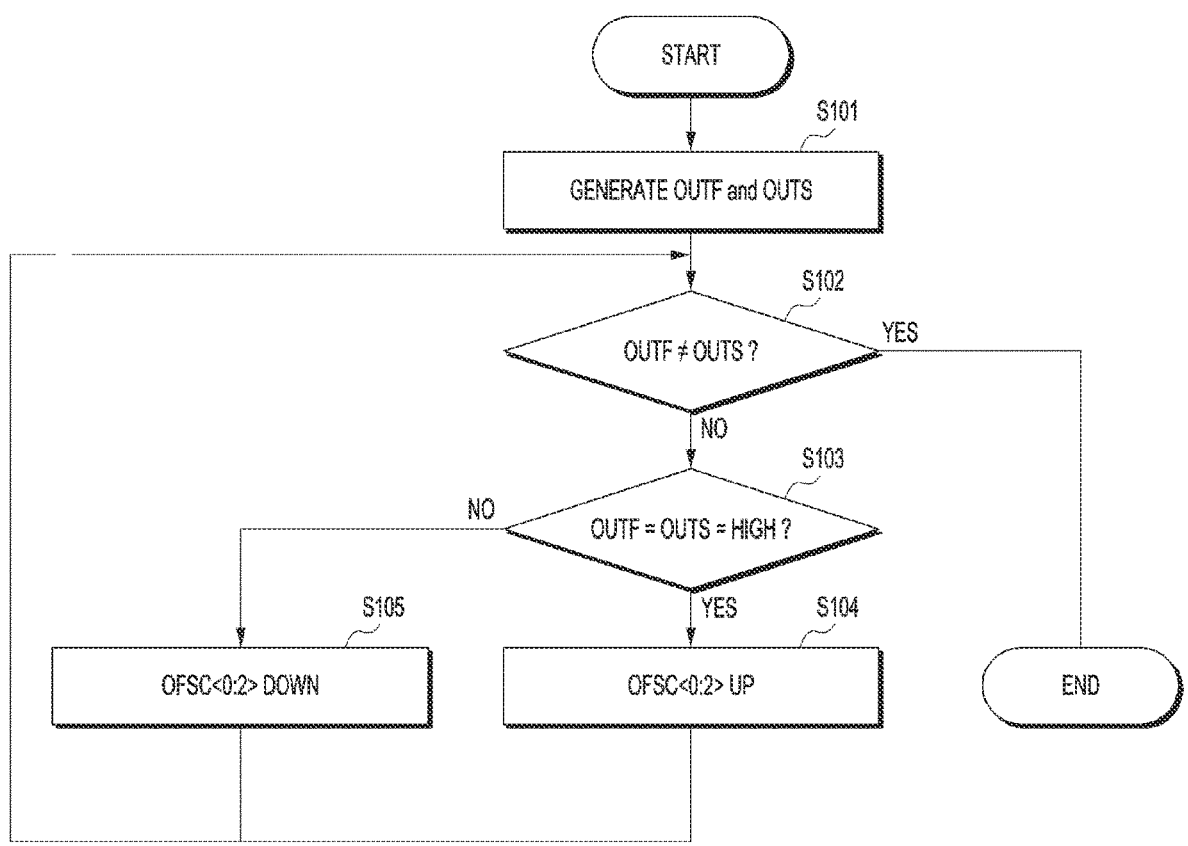
FIG. 8 is a flowchart for explaining an offset adjustment method of the duty cycle correction circuit in accordance with another embodiment of the present disclosure.

FIG. 8 is a flowchart for explaining an offset adjustment method of the duty cycle correction circuit 200 in accordance with another embodiment of the present disclosure.

First, an offset detection method of the present disclosure will be described.

For example, in a state in which there is no offset in the first input terminal (+) and the second input terminal (−) of the comparator 220 of FIG. 5, it is assumed that the duty detection signal OUTP is at a high level as the first combination (OUT1=CLKDC and OUT2=CLKBDC) is inputted.

The duty detection signal OUTP may be outputted at a low level since there is no offset, when the second combination (OUT1=CLKBDC and OUT2=CLKDC) is inputted to the first input terminal (+) and the second input terminal (−) of the comparator 220.

Meanwhile, in a case where there is an offset in at least to one of the first input terminal (+) and the second input terminal (−), when the duty detection signal OUTP is at a high level as the first combination (OUT1=CLKDC and OUT2=CLKBDC) is inputted, even when the second combination (OUT1=CLKBDC and OUT2=CLKDC) is inputted, the duty detection signal OUTP may be at a high level.

Accordingly, the present disclosure may determine whether there is an offset, that is, whether there is an offset that may cause a variation in the level of OUTP, by comparing the values of the duty detection signal OUTP with each other according to the first combination and the second combination of the duty-adjusted differential clock signals CLKDC and CLKBDC.

Next, the offset adjustment method of the duty cycle correction circuit 200 in accordance with another embodiment will be described.

By controlling the input switching unit 210, the first combination (OUT1=CLKDC and OUT2=CLKBDC) and the second combination (OUT1=CLKBDC and OUT2=CLKDC) are sequentially switched and inputted to the comparator 220, thereby generating the first order detection signal OUTF and the second order detection signal OUTS (S101).

It is determined whether the first order detection signal OUTF and the second order detection signal OUTS have different values (S102).

As a result of the determination in step S102, when the first order detection signal OUTF and the second order detection signal OUTS have different values, there is no offset or the offset will not affect the circuit operation. Therefore, the offset adjustment operation may be ended and a normal duty cycle correction operation may be performed.

As a result of the determination in step S102, when the is first order detection signal OUTF and the second order detection signal OUTS have substantially the same value, an offset will affect the circuit operation. Since there is the offset, it is necessary to determine whether the offset is an offset that increases the level of the input terminal or an offset that decreases the level of the input terminal.

Accordingly, it is determined whether the first order detection signal OUTF and the second order detection signal OUTS are both at a high level (S103).

As a result of the determination in step S103, when the first order detection signal OUTF and the second order detection signal OUTS are both at a high level, the values of the offset adjustment codes OFSC<0:2> are increased (S104).

As the values of the offset adjustment codes OFSC<0:2> are increased, by increasing the amount of current of the first input terminal (+) and decreasing the amount of current of the second input terminal (−), the offset adjustment unit 222 of the comparator 220 described with reference to FIG. 7 may perform an offset adjustment operation.

After step S104 is performed, step S102 of determining whether the first order detection signal OUTF and the second order detection signal OUTS have different values is performed again.

Steps S102 to S104 may be repeatedly performed until the first order detection signal OUTF and the second order detection signal OUTS have different values. That is, until the second order detection signal OUTS reaches a low level, steps S102 to S104 may be repeatedly performed.

Step S101 may also be repeatedly performed until the first order detection signal OUTF and the second order detection signal OUTS have different values. That is, the operation in which the first combination (OUT1=CLKDC and OUT2=CLKBDC) and the second combination (OUT1=CLKBDC and OUT2=CLKDC) are sequentially switched and inputted to the comparator 220 may be repeated.

As a result of the determination in step S103, when neither the first order detection signal OUTF nor the second order detection signal OUTS is at a high level, that is, are both at a low level, the values of the offset adjustment codes OFSC<0:2> are decreased (S105).

As the values of the offset adjustment codes OFSC<0:2> are decreased, by decreasing the amount of current of the first input terminal (+) and increasing the amount of current of the second input terminal (−), the offset adjustment unit 222 of the comparator 220 described with reference to FIG. 7 may perform an offset adjustment operation.

After step S105 is performed, step S102 of determining whether the first order detection signal OUTF and the second order detection signal OUTS have different values is performed again.

Until the first order detection signal OUTF and the second order detection signal OUTS have different values, steps S102, S103, and S105 may be repeatedly performed.

That is, steps S102, S103, and S105 may be repeatedly performed until the second order detection signal OUTS reaches a high level.

Step S101 may also be repeatedly performed until the first order detection signal OUTF and the second order detection signal OUTS have different values. That is, the operation in which the first combination (OUT1=CLKDC and OUT2=CLKBDC) and the second combination (OUT1=CLKBDC and OUT2=CLKDC) are sequentially switched and inputted to the comparator 220 may be repeated.

As described above, a person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:
1. A duty cycle detection circuit comprising:
an input switching unit configured to receive differential input signals and output at least one of a first combination of first and second output signals and a second combination of the first and second output signals, according to at least one of a plurality of control signals; and
a comparator configured to receive the first output signal through a first input terminal thereof, to receive the second output signal through a second input terminal thereof, to compare the received first output signal and the received second output signal to generate a duty detection signal according to at least another one of the plurality of control signals, and to adjust an offset of at least one is of the first input terminal and the second input terminal.

2. The duty cycle detection circuit according to claim 1, wherein, in the first combination, a first differential input signal is the first output signal and a second differential input signal is the second output signal, and in the second combination, the second differential input signal is the first output signal and the first differential input signal is the second output signal.

3. The duty cycle detection circuit according to claim 1, wherein the input switching unit includes a multiplexer configured to multiplex the first and the second differential input signals according to an input switching control signal, and output of the multiplexer is outputted as the first output signal and an inverted output signal of the multiplexer is outputted as the second output signal.

4. The duty cycle detection circuit according to claim 1, wherein the comparator comprises:

a comparison unit configured to generate the duty detection signal by comparing the signal of the first input terminal and the signal of the second input terminal; and at least one offset adjustment unit configured to adjust the offset of at least one of the first input terminal and the second input terminal according to at least one offset adjustment code.

5. The duty cycle detection circuit according to claim 1, wherein the comparator comprises:

a comparison unit including a plurality of transistors constituting a first current path and a second current path electrically connected to a power supply terminal; and a plurality of digital-to-analog conversion units electrically connected in parallel to each of the first current path and the second current path and configured to form a plurality of current paths.

6. The duty cycle detection circuit according to claim 1, further comprising:

an offset control logic configured to generate at least one of the plurality of control signals by comparing duty detection signals generated according to the first combination and second combination of the first and second output signals.

7. The duty cycle detection circuit according to claim 6, further comprising:

a storage unit configured to store the duty detection signals to generated according to the first and second combinations of the first and second output signals and to provide the stored duty detection signals to the offset control logic.

8. A duty cycle detection circuit comprising:

an input switching unit configured to output differential input signals as a first combination of first and second output signals when an input switching control signal is at a first level, and to output the differential input signals as a second combination of the first and second output signals when the input switching control signal is at a second level;

a comparator configured to receive the first output signal through a first input terminal thereof, to receive the second output signal through a second input terminal thereof, to compare the received first and second output signals to generate duty detection signals and to adjust an offset of at least one of the first input terminal and the second input terminal according to offset adjustment codes; and an offset control logic configured to compare the duty detection signals to generate the offset adjustment codes by comparing duty detection signals generated according to the first and second combinations.

9. The duty cycle detection circuit according to claim 8, further comprising:

a storage unit configured to store the duty detection signals generated according to the first combination and the second combination and to provide the stored duty detection signals to the offset control logic.

10. The duty cycle detection circuit according to claim 8, wherein, in the first combination, a first differential input signal is the first output signal and a second differential input signal is the second output signal, and in the second combination, the second differential input signal is the first output signal and the first differential input signals is the second output signal.

11. The duty cycle detection circuit according to claim 8, wherein the input switching unit includes a multiplexer configured to multiplex the first and the second differential input signals according to an input switching control signal, and output of the multiplexer is outputted as the first output signal and an inverted output signal of the multiplexer is outputted as the second output signal.

12. The duty cycle detection circuit according to claim 8, wherein the comparator comprises:

a comparison unit including a plurality of transistors constituting a first current path and a second current path electrically connected to a power supply terminal; and a plurality of digital-to-analog conversion units electrically connected in parallel to each of the first current path and the second current path and configured to form a plurality of current paths.

* * * * *